United States Patent
Kori et al.

(10) Patent No.: US 11,070,173 B2
(45) Date of Patent: Jul. 20, 2021

(54) WIDE BAND DOHERTY POWER AMPLIFIER

(71) Applicant: Honeywell International Inc., Morris Plains, NJ (US)

(72) Inventors: Manoj Kumar Kori, Bangalore (IN); Alfonso Malaga, Sammamish, WA (US); Anjaya Chary Boddupally, Bangalore (IN); Narayan Singh Rana, Bangalore (IN)

(73) Assignee: Honeywell International Inc., Charlotte, NC (US)

(*) Notice: Subject to any disclaimer, the term of this patent is extended or adjusted under 35 U.S.C. 154(b) by 53 days.

(21) Appl. No.: 16/536,304

(22) Filed: Aug. 8, 2019

(65) Prior Publication Data

US 2021/0044255 A1    Feb. 11, 2021

(51) Int. Cl.
*H03F 1/02* (2006.01)
*H03F 3/21* (2006.01)
(Continued)

(52) U.S. Cl.
CPC ............ *H03F 1/0288* (2013.01); *H03F 1/56* (2013.01); *H03F 3/193* (2013.01); *H03F 3/21* (2013.01)

(58) Field of Classification Search
CPC .......... H03F 1/0288; H03F 3/193; H03F 1/56; H03F 3/21
(Continued)

(56) References Cited

U.S. PATENT DOCUMENTS 5,568,086 A    10/1996   Schuss et al.
8,611,834 B2 * 12/2013  Harris ................ H03F 1/0288
                                                    455/114.1
(Continued)

FOREIGN PATENT DOCUMENTS

CN           207399144 U      5/2018

OTHER PUBLICATIONS

Bousnina, "Maximizing Efficiency and Linearity", IEEE Microwave Magazine, Aug. 2009, pp. 99-107, IEEE.
(Continued)

*Primary Examiner* — Hieu P Nguyen
(74) *Attorney, Agent, or Firm* — Fogg & Powers LLC

(57) ABSTRACT

A wideband power amplifier is presented. The wideband power amplifier configured to be coupled to a load having an impedance $Z_L$, where the wideband power amplifier comprises: a quadrature coupler; a carrier amplifier coupled to the quadrature coupler; a peak amplifier coupled to the quadrature coupler; wherein the carrier amplifier saturates at an input power level lower than the input power level at which the peak amplifier saturates; wherein each of the carrier amplifier and the peak amplifier has a termination impedance of approximately $R_{opt}$, where $R_{opt}$ is the optimum impedance at which the carrier amplifier and the peak amplifier will deliver rated max powers; a impedance transformer, coupled to the carrier amplifier having a characteristic impedance of $2*R_{opt}$; an impedance transformer, coupled to the peak amplifier and the impedance transformer; wherein the impedance transformer is configured transform a load impedance $Z_L$ to $2*R_{opt}$.

20 Claims, 9 Drawing Sheets

(51) Int. Cl.
*H03F 3/193* (2006.01)
*H03F 1/56* (2006.01)

(58) Field of Classification Search
USPC .......................... 330/295, 124 R, 86, 53–54
See application file for complete search history.

(56) References Cited

U.S. PATENT DOCUMENTS

| | | | | |
|---|---|---|---|---|
| 9,209,511 | B2* | 12/2015 | Mei | H01P 5/12 |
| 10,523,158 | B2* | 12/2019 | Shinjo | H03F 3/19 |
| 2017/0019072 | A1 | 1/2017 | Kobayashi et al. | |

OTHER PUBLICATIONS

Jung et al., "Doherty Power Amplifier with an Optimized Load Network for Improved Linearity and Efficiency", Jan. 2008, pp. 24-28 (cover p. 1).

Moon et al., "Efficiency Enhancement of Doherty Amplifier by Mitigating the Knee Voltage Effect", IEEE Transactions on Microwave Theory and Techniques, Jan. 2011, pp. 1-10, vol. 59, No. 1, IEEE.

Raab, "Efficiency of Doherty RF Power-Amplifier Systems", IEEE Transactions on Broadcasting, Sep. 1987, pp. 77-83, vol. BC-33, No. 3, IEEE.

Sahan, "Innovative Approaches in Doherty Amplifier Design for Higher Efficiency and Wider Frequency Bandwidth", A Thesis Submitted for the Degree of Doctor of Philosophy in Electrical and Electronics Engineering, Mar. 2013, pp. 1-122, Middle East Technical University.

Wu et al., "A Modified Doherty Configuration for Broadband Amplification Using Symmetrical Devices", IEEE Transactions on Microwave Theory and Techniques, Oct. 2012, pp. 1-13, vol. 60, No. 10, IEEE.

Zhao et al., "Analysis and Design of CMOS Doherty Power Amplifier Based on Voltage Combining Method", IEEE Access, Mar. 2017, pp. 5001-5012, vol. 5, IEEE.

Boumaiza et al. "Broadband Doherty Power Amplifiers: Advances and Challenges", Crown, 2014, pp. 1-6.

European Patent Office, "Extended European Search Report from EP Application No. 20190354.9", from Foreign Counterpart to U.S. Appl. No. 16/536,304, dated Dec. 18, 2020, pp. 1-18, Published: EP.

Fang et al. "Improving Power Utilization Factor of Broadband Doherty Amplifier by Using Bandpass Auxiliary Transformer", IEEE Transactions on Microwave Theory and Techniques, Sep. 2015, pp. 2811-2820, vol. 63, No. 9, IEEE.

Slade, "The Basics of the Doherty Amplifier", at least as early as Dec. 15, 2020, pp. 1-16, Orban Microwave Products, www.orbanmicrowave.com.

* cited by examiner

WIDE BAND DOHERTY POWER AMPLIFIER

BACKGROUND

There is a growing need for power amplifiers that are more efficient to reduce the amount of power consumed and to reduce the heat dissipated by these amplifiers in order to shrink the components which rely on power amplification. Aircraft radios, reliant on power amplification, are one area in current need of power amplification advancement. Unlike some other applications of power amplifiers, aircraft radios operate over a wide band of approximately 118 MHz to 137 MHz rather than a narrow band or even a singular frequency. One set aircraft radio, for example, the Very High Frequency (VHF) Voice Data Link (VDL) MODE2 radio transmitters use class A/AB power amplifiers which are highly linear, but lack power efficiency. This poor efficiency results in the need for bulky heat sinks and active cooling, both of which can add significant weight.

Relatively power efficient power amplifiers do exist, one being the Doherty power amplifier. The Doherty power amplifier accommodates signals with higher peak to average ratios than other amplifiers. The Doherty power amplifier accomplishes this using parallel amplifiers—a primary carrier amplifier and a secondary peak amplifier. At low power levels, the carrier amplifier bears the entirety of the power amplification of the Doherty power amplifier. After the power increases past a threshold and the carrier amplifier is close to saturation, the peak amplifier becomes able to share the power amplification responsibilities with the carrier amplifier. Unfortunately, the current Doherty power amplifiers are limited to narrow band operation (~<8%). As many radios operate over a wider band (for example, some aircraft radios operate in the band from 118 MHz to 137 MHz (15%)), these radios cannot use the Doherty amplifier to improve power efficiency.

SUMMARY

A wideband power amplifier is provided. The wideband power amplifier configured to be coupled to a load having an impedance ZL, where the wideband power amplifier comprises: a quadrature coupler, implemented with lumped element impedance transformation circuitry, comprising an input, a first output, and a second output: a carrier amplifier comprising an input and an output, where the input of the carrier amplifier is coupled to the first output of the quadrature coupler; a peak amplifier comprising an input and an output, where the input of the peak amplifier is coupled to the second output of the quadrature coupler; wherein the carrier amplifier saturates at an input power level lower than the input power level at which the peak amplifier saturates; wherein each of the carrier amplifier and the peak amplifier has a termination impedance of approximately Ropt, where Ropt is the optimum impedance at which the carrier amplifier and the peak amplifier will deliver rated max powers; a impedance transformer, implemented with lumped element impedance a transformation circuitry, comprising an input and an output, and having a characteristic impedance of 2*Ropt; an impedance transformer, implemented with lumped element impedance transformation circuitry, comprising an input and an output, and where the input of the impedance transformer is coupled to the output of the peak amplifier and the output of the impedance transformer; wherein the impedance transformer is configured transform a load impedance ZL to 2*Ropt; and wherein a change in a phase shift over frequency of the impedance transformer is cancelled by a corresponding opposite change in phase shift of the quadrature coupler over at least a bandwidth, of fifteen percent or more of the center frequency, about the center frequency.

DRAWINGS

Embodiments of the present invention can be more easily understood and further advantages and uses thereof more readily apparent, when considered in view of the description of the embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized, and that logical, mechanical and electrical changes may be made without departing from the scope of the present invention. The following detailed description is, therefore, not to be taken in a limiting sense.

The wide band Doherty amplifier described below and shown in the Figures resembles a conventional Doherty amplifier in that it uses two amplifiers—a carrier amplifier and a peak amplifier—to provide high efficiency amplification over a range of input powers beyond the capabilities of either amplifier alone. The wide band Doherty amplifier differs from a conventional Doherty amplifier through a modified load modulation concept and novel lumped element implementation for VHF frequency range, a wideband quadrature coupler, and a wideband impedance transformer. The lumped element implementation enables the wide band Doherty amplifier to be contained within a small housing. However, unlike with other lumped element implementations, the efficiency of the wide band Doherty amplifier prevents the excessive heating of the lumped element components. These modifications to the conventional Doherty amplifier enables the wide band Doherty amplifier to operate over a wide range of frequencies whereas the conventional Doherty amplifier operates over a narrow band of frequencies. Conventional Doherty amplifiers rely on frequency-dependent components, each of which are addressed by the wide band Doherty amplifier configuration. The wide band Doherty amplifier is configured to provide power amplification. Specifically, the Doherty amplifier can be configured to provide power amplification in an aviation radio, for example a VHF VDL Mode2 transmitter.

Figure 1:
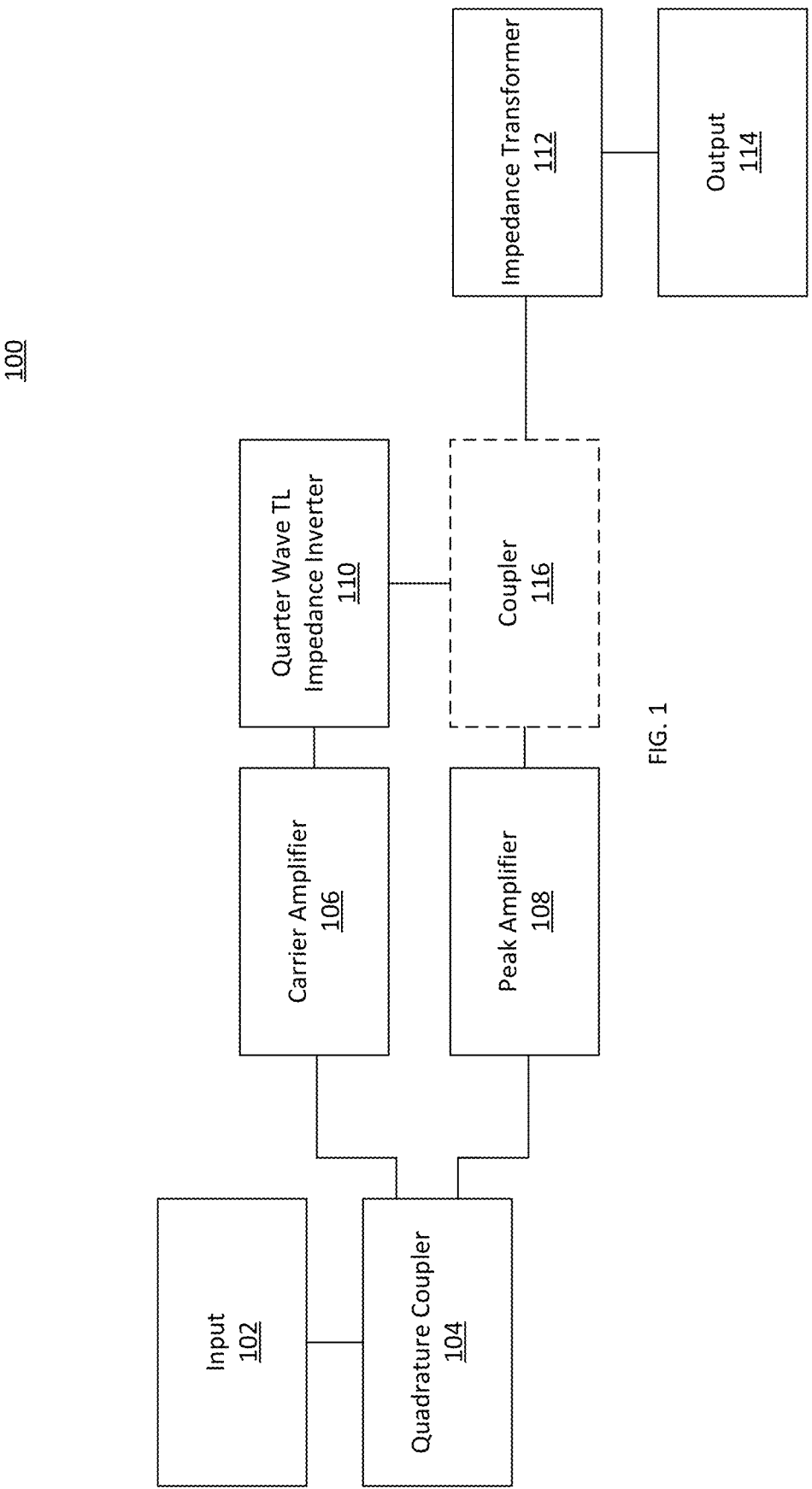
FIG. 1 is a circuit diagram of one embodiment of a wide band Doherty amplifier.

FIG. 1 depicts a block diagram of a power amplifier in accordance with one embodiment of the present invention. Amplifier 100 includes input 102 for receiving input signals. The input 102 provides the input signals to a quadrature coupler 104. The quadrature coupler 104 provides output to a carrier amplifier 106 and a peak amplifier 108. The output of the carrier amplifier 106 couples to an input of a quarter wave transmission line (TL) impedance inverter 110. The output of the quarter wave TL impedance inverter 110 and the output of the peak amplifier 108 couple to the input of an impedance transformer 112 which provides an output to the output port 114. The input port 102 is configured to receive an input from any appropriate wideband circuit such as a low power block or mixer. The resistance of the input port 102 can be modified to correspond with the requirements of other electronics. The output port 114 is configured to provide an output to any appropriate wideband circuit such as a radio antenna which may be configured to provide a 50Ω load. The resistance of the output port 114 can be modified to correspond with the requirements of other electronics. The input port 102 and the output port 114 are configured to couple to external components with a load having a characteristic impedance of $Z_L$.

The quadrature coupler 104 is configured as a hybrid quadrature couple, configured to provide a phase difference between the carrier amplifier 106 and the peak amplifier 108. The quadrature coupler 104 comprises a single input, coupled to the input port 102, and two outputs; a first output coupled to the carrier amplifier 106 and a second output coupled to the peak amplifier 108. The quadrature coupler 104 is configured to provide wideband 3 dB power splitting and phase shift compensation of the impedance inverter 110 over wideband frequencies. As well, the quadrature coupler 104 is configured to provide a linear phase difference between the carrier amplifier 106 and the peak amplifier 108 across a wideband range of frequencies, for example 118 MHz to 137 MHz. In one example, further depicted in FIG. 2, the phase difference between the carrier amplifier 106 and the peak amplifier 108 ranges linearly from 80.37 degrees at 117 MHz to 95.6 degrees at 137 MHz.

In one embodiment, the carrier amplifier 106 operates alone at low input signal power levels, in some examples below 6 dB back off from saturation, also referred to as 6 dB back off, whereas the peak amplifier 108 operates at high input signal power levels, when the carrier amplifier 106 is close to saturation, for example, above 6 dB back off. While the carrier amplifier 106 is close to saturation, the peak amplifier 108 may gradually amplify a greater percentage of the total input signal. In one embodiment, the carrier amplifier 106 and peak amplifier 108 each comprise Gallium Arsenide (GaAs) transistors. In other embodiments, the carrier amplifier 106 and the peak amplifier 108 may each comprise one or more GaAs transistors, GaN transistors, field effect transistors (FETs), paedomorphic high electron mobility transistors (PHEMTs), MESFETs, heterostructure field effect transistors (H-FETs), LDMOS, High-electron-mobility transistors (HEMTs), and/or other three terminal devices. In some examples, the Carrier amplifier 106 has a gate width or periphery of between 10 and 20 millimeters, and around 15 millimeters. Carrier amplifier 106 is desirably biased as a class "A" amplifier, a class "B" amplifier, or a class "AB" amplifier. The carrier amplifier 106 and the peak amplifier 108 are symmetric, requiring that the two amplifiers comprise the same transistor set. Though, the carrier amplifier 106 and the peak amplifier 108 may be biased differently.

Peak amplifier 108 does not share the same bias as the carrier amplifier 106. In some embodiments, peak amplifier 108 is biased as or similar to a class "C" amplifier. Because of this condition, peak amplifier 108 is pinched off (turned off) at low signal levels, for example when the carrier amplifier 106 is unsaturated, and its output looks like an open circuit, and its output impedance is high. Those of ordinary skill in the art understand how to design devices for the amplifiers having the above discussed characteristics.

The output of carrier amplifier 106 (i.e. the drain) is coupled to the quarter wave TL impedance inverter 110. The quarter wave transmission line impedance inverter 110, in one embodiment, has a characteristic impedance of $Z_t$ where:

$$Z_t = 2 * R_{opt} \qquad 1$$

$R_{opt}$ is the termination impedance, the optimum load impedance of the carrier amplifier 106 and the peak amplifier 108 while outputting at peak power. In other words, $R_{opt}$ is the optimum impedance at which the carrier amplifier and the peak amplifier will deliver rated maximum powers. In some examples, $Z_t$ may be around $R_{opt}$. It is understood that impedances near or approximately $R_{opt}$ may be used instead of $R_{opt}$ which still achieving similar results. The peak amplifier 108 is built as a class "C" amplifier which exhibits suitable efficiency and intermodulation performance and has independent bias variability. In some embodiments, the insertion phase of carrier amplifier 106 and peak amplifier 108 is controlled or well matched. The quarter wave TL impedance inverter 110 is configured such that the carrier amplifier 106 perceives a consistent load at any frequency within the wideband of frequencies.

The outputs of the quarter wave TL impedance inverter 110 and the peak amplifier 108 are combined for the input of the impedance transformer 112. In some embodiments, a separate component 116 is used to combine the in-phase outputs of the quarter wave TL impedance inverter 110 and the peak amplifier 108. One skilled in the art would be able to understand and implement this separate component configured to couple two inputs.

Amplifier 100 may be built on a single gallium arsenide (GaAs) substrate. In one embodiment, only carrier amplifier 106 and peak amplifier 108 are built on a GaAs substrate. In some embodiments, the devices used for amplifier 106 and 108 are fabricated with tapered feeds on the input and/or output to help eliminate distributive effects that result from the amplifiers size. Beryllia is used in some embodiments because of its high thermal conductivity. Those with skill in the art will understand that other substrates may also be suitable.

The operation of amplifier 100 is best understood in two extremes—low signal power levels and high signal power levels. At low power levels there is not enough radio frequency (RF) power to activate the peak amplifier 108. Thus, at the 6 dB back-off power and below, the carrier amplifier 106 delivers its power into $2*R_{opt}$. At peak power, the load seen by the quarter-wave TL impedance inverter 110 is equal to twice its characteristic impedance, thus the carrier amplifier 106 delivers twice the current of the peak amplifier. As a result, the carrier amplifier 106 saturates at its maximum output power while providing a high efficiency. In some examples, the peak power output is around 45 dBm.

At low power levels, peak amplifier 108 is pinched off and the output of peak amplifier looks like an open circuit at combination of the quarter wave TL impedance inverter 110 and the impedance transformer 112. Therefore, at low signal levels, the open circuit optimum load impedance of peak amplifier 108 does not affect the load for carrier amplifier 106.

When there is sufficient power to fully turn on both carrier amplifier 106 and peak amplifier 108, both amplifiers perceive the optimum load while maintaining maximum power. Thus, efficiency is maintained at higher power levels.

In between the point where carrier amplifier 106 is operating at low RF signal levels and the point where peak amplifier 108 is fully turned on, peak amplifier 108 gradually becomes active as the RF signal level increases. During this time, the impedance seen by carrier amplifier 106 changes from $2*R_{opt}$ where $R_{opt}$ is the optimum load impedance of the carrier amplifier 106 to $R_{opt}$. The impedance seen by the carrier amplifier 106 changes because the optimum load impedance of the peak amplifier 108 gradually changes from an open circuit as the RF drive level increases and the peak amplifier 108 turns on. As the impedance seen at the impedance transformer 112 looking into the output of the peak amplifier 108 change from an open circuit, the impedance seen by the carrier amplifier 106 also changes eventually reaching a value of $R_{opt}$ at full power. The result of the changing load is that carrier amplifier 106 is kept at the onset of saturation until the peak amplifier 108 becomes saturated. Thus, amplifier 100 effectively enables the power amplification beyond the point where a normal class "B" or class "AB" amplifier begins to saturate, and over this range, the efficiency of amplifier 100 remains close to the maximum efficiency of the carrier amplifier 106 beyond power capabilities of the carrier amplifier 106.

The drain bias circuitry of standard linear power amplifiers is often designed to obtain drain currents that vary almost proportionally to RF signal amplitude in order to maintain efficient operation at both high and low signal amplitudes. However, when noise like signals are injected into these amplifiers, the drain current varies with bandwidth similar to that of the RF bandwidth. This generally results in large drain voltage changes which severely degrades linearity and efficiency.

The drain bias circuit for carrier amplifier 106 and peak amplifier 108 are chosen so that the component of drain current at the noise signal bandwidth is bypassed. With this bias configuration, the drain current does not vary with bandwidth, but varies more proportionally with RF signal level. As a result, efficiency is greatly enhanced.

The quarter wave TL impedance inverter 110 is configured to provide the load on the carrier amplifier 106 of $Z_t=2*R_{opt}$. The quarter wave TL impedance inverter 110 also serves to provide a phase shift to the output of the carrier amplifier 106 proportional to the phase shift provided by the quadrature coupler 104 to the output signal for the peak amplifier 108. Thus, the output signals of the quarter wave TL impedance inverter 110 and the output of the peak amplifier 108 are in phase where coupled to the impedance transformer 112.

In some embodiments, the impedance transformer 112 is configured to operate as a two-stage impedance transformation. The two-stage impedance transformation ensures that a constant impedance is presented to the combiner 116 across the entire wideband, 118 MHz-137 MHz. In some examples, more than two-stages may be used to provide a similar benefit as the two-stage impedance transformation. Two-stage refers to the two inductors capacitor combination as further depicted in the example shown in FIG. 4. The impedance transformer 112 is configured to transform the $Z_L$ to $2*R_{opt}$. In some examples, a change in a phase shift over frequency of the impedance transformer 112 is cancelled by a corresponding opposite change in phase shift of the quadrature coupler 104 over at least a bandwidth, of fifteen percent or more of the center frequency, about the center frequency.

The improved Doherty power amplifier gain is highly efficient in saturated output point back within 6 dB back off. At 6 dB back off and below, the peak amplifier is not operating. At peak power, the load seen by quarter-wave transmission line impedance inverter 110 is 4*Ropt. At 6 dB back off power and below, the load seen by the quarter-wave transmission line impedance inverter 110 is equal to its characteristic impedance, 2*Ropt. Thus, the carrier amplifier 106 sees a constant load of 2*Ropt. This ensures a broadband characteristic at 6 dB back-off power and below.

Figure 2:
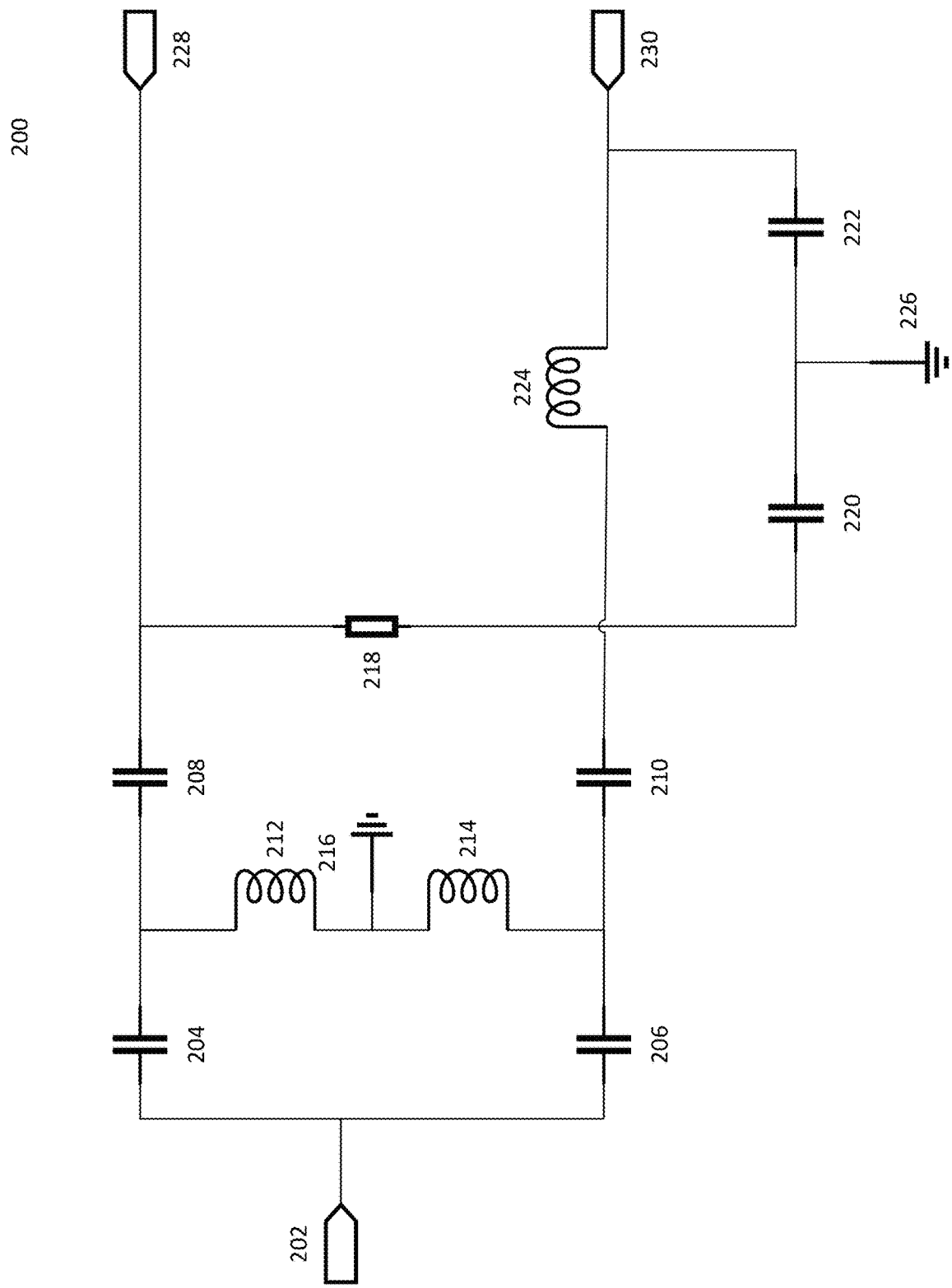
FIG. 2 is one embodiment of a lumped element quadrature hybrid coupler.

FIG. 2 depicts a lumped circuit implementation 200 of the quadrature coupler 104. The lumped circuit implementation 200 shown in FIG. 2, and the other lumped circuit implementations shown in subsequent figures, depict an embodiment where the power amplifier is spatially contained. It is understood that similar results can be achieved by the same elements not spatially constrained. The lumped circuit implementation 200 depicts one possible implementation of the quadrature coupler; however, it is understood that one skilled in the art may modify the circuit diagram with similar results. The lumped circuit implementation 200 comprises basic electronic elements such as capacitors, resistors, and inductors. It is understood that one having skill in the art understands how to use and reproduce these basic electronic elements. The input port 202 of the lumped circuit implementation 200 corresponds to the input port 102 of the quadrature coupler 104. A first capacitor 204 comprises a first port and a second port, and a second capacitor 206 comprises a first port and second port. The second port of the first capacitor and the second port of the second capacitor couple to the input port 202. A third capacitor 208 comprises a first port and second port, a fourth capacitor 210 comprises a first port and a second port, a first inductor 212 comprises a first port and a second port, and a second inductor 214 comprises a first port and a second port. The first port of the first capacitor 204 and the first port of the third capacitor 208 are coupled to the first port of the first inductor 212. The first port of the second capacitor 206 and the first port of the fourth capacitor 210 are coupled to the first port of the second inductor 214. The second port of the first inductor 212 and the second port of the second inductor 214 couple to a ground 216. A first resistor 218 comprises a first port and a second port, where the first port of the resistor 218 couples to the second port of the third capacitor 208 forming a first output 228 of the lumped element implementation 200 corresponding to the first output of the quadrature coupler 104. A fifth capacitor 220 comprises a first port and a second port, a sixth capacitor 222 comprises a first port and second port, and a third inductor 224 comprises a first port and a second port. The second port of the first resistor 218, the second port of the fourth capacitor 210, the first port of the fifth capacitor 220 all couple to the first port of the third inductor 224. The second port of the fifth capacitor 220 and the second port of the sixth capacitor 222 couple to ground 226. The second port of the third inductor 224 couples to the first port of the sixth capacitor 222, forming the second output 230 of the quadrature coupler 104.

In one embodiment, the components of the lumped circuit implementation 200 have the following values. These values correspond to an embodiment where the phase match and compensation are consistent across a wide band of approximately 118 MHz to 136 MHz. It is understood that these values can be manipulated by one skilled in the art to produce similar results and that these are provided as an example. In this embodiment, the input port 202 is configured to have a resistance of 50Ω. The first capacitor 204, the second capacitor 206, the third capacitor 208, and the fourth capacitor 210 each is configured to have a capacitance of 17.7 pF. The first inductor 212 and the second inductor 214 each is configured to have an inductance of 88.6 nH. The first resistor 218 has a resistance of 100Ω. The third inductor 224 is configured to have an inductance of 62 nH. The fifth capacitor 220 and the sixth capacitor 222 each is configured to have a capacitance of 25 pF. The first output port 228 and the second output port 230 each are configured to have a resistance of 50Ω.

Figure 3:
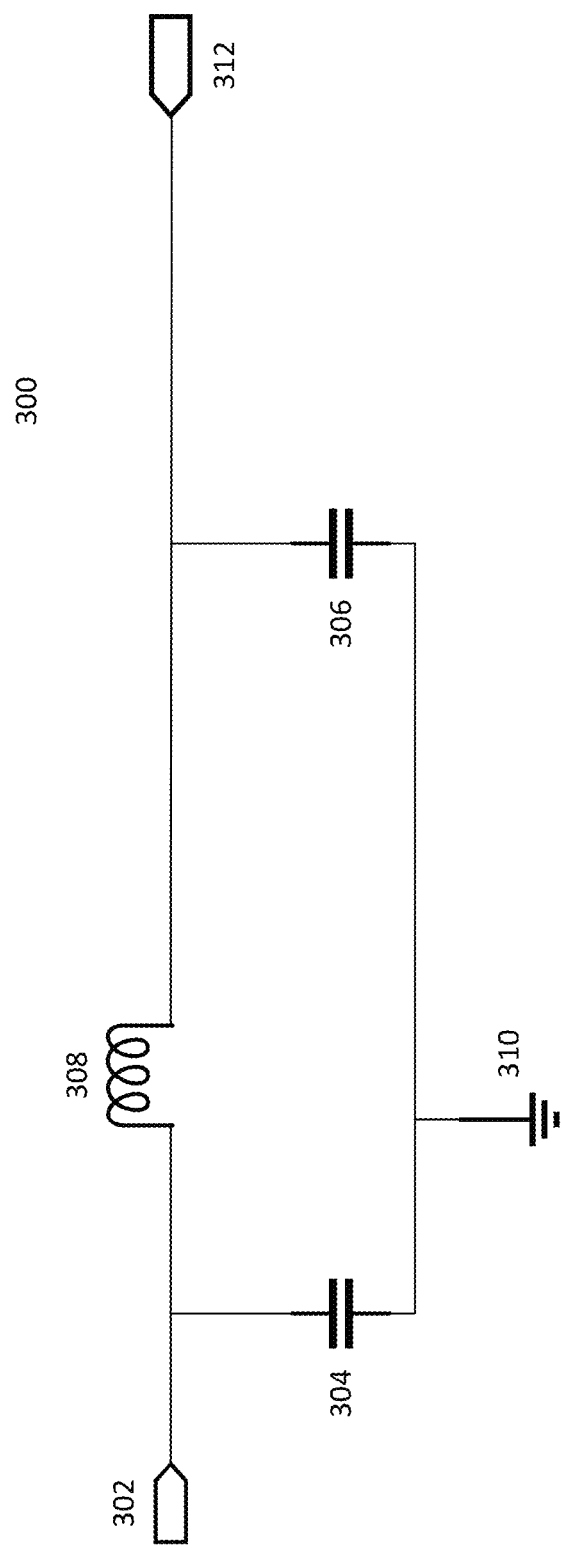
FIG. 3 is one embodiment of a lumped element quarter wave transmission line (TL) impedance inverter.

FIG. 3 depicts a circuit diagram 300 of the lumped element implementation for VHF within the quarter wave TL impedance inverter 110. The circuit diagram 300 depicts one possible implementation of the quarter wave TL impedance inverter 110; however, it is understood that one skilled in the art may modify the circuit diagram with similar results. The lumped element quarter wave TL impedance inverter 300 comprises an input port 302 and an output port 312 corresponding to the input and output respectively of the quarter wave TL Impedance Inverter 110. A seventh capacitor 304 comprises a first port and a second port; an eighth capacitor 306 comprises a first port and a second port; and a fourth inductor 308 comprises a first port and a second port. The input port 302 couples to the first port of the seventh capacitor 304 and the first port of the fourth inductor 308. The second port of the fourth inductor 308 couples to the first port of the eighth capacitor 306 to form the output port 312. The second port of the seventh capacitor 304 and the second port of the eight capacitor 306 couple to ground.

In one embodiment, the components of the lumped circuit implementation 300 have the following values. These values correspond to an embodiment where the phase match and compensation are consistent across a wide band of approximately 118 MHz to 136 MHz. It is understood that these values can be manipulated by one skilled in the art to produce similar results and that these are provided as an example. The input port 302 and the output port 312 each is configured to have a resistance of 40Ω. The seventh capacitor 304 and the eighth capacitor 306 each is configured to have a capacitance of 31.3 pF. The fourth inductor 308 is configured to have an inductance of 50 nH.

Figure 4:
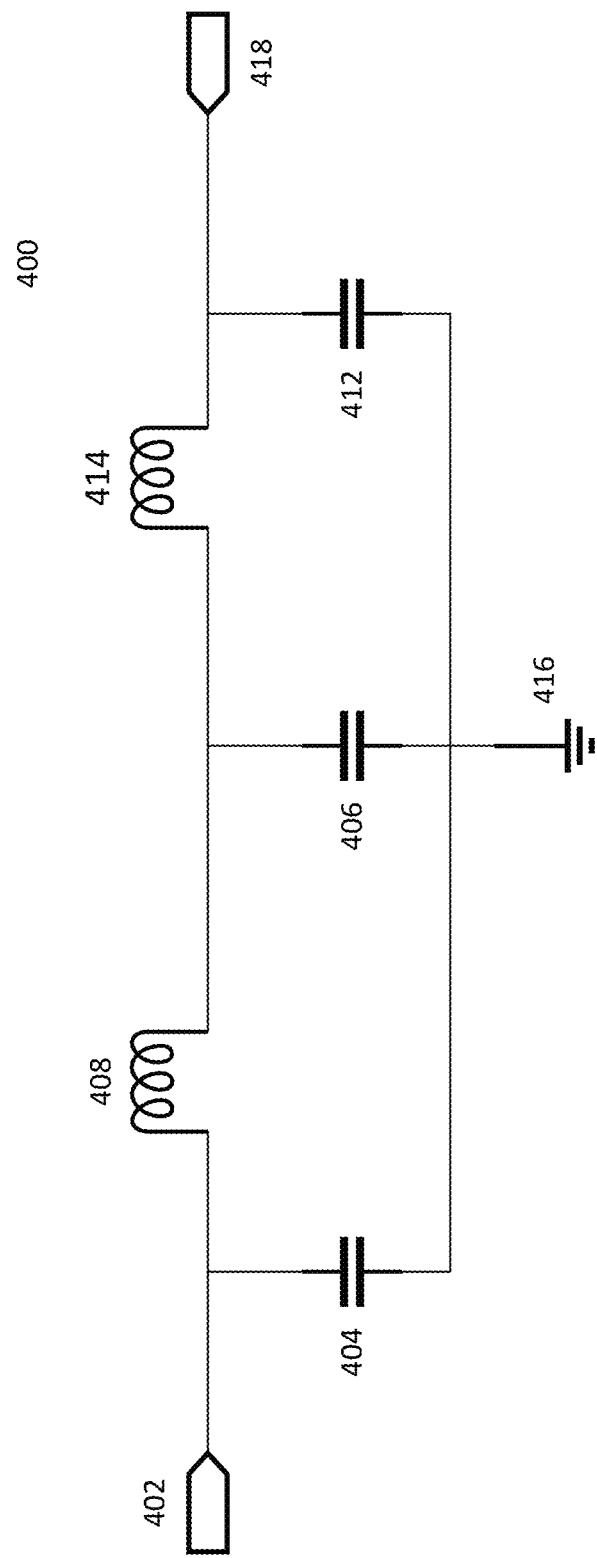
FIG. 4 is one embodiment of a lumped element impedance transformer.

FIG. 4 depicts a circuit diagram 400 of the lumped element implementation for VHF within the impedance transformer 112. The circuit diagram 400 depicts one possible implementation of the wideband impedance transformer; however, it is understood that one skilled in the art may modify the circuit diagram with similar results. This lumped element wideband impedance transformer 400 is configured to transform the output load, often 50Ω, to $2*R_{opt}$ at its input over wideband. The wideband impedance transformer 400 comprises an input port 402 and an output port 418 corresponding to the input and output respectively of the impedance transformer 112. A ninth capacitor 404 comprises a first port and a second port; a tenth capacitor 406 comprises a first and a second port; and an eleventh capacitor 412 comprises a first and a second port. A fifth inductor 408 comprises a first and a second port, and a sixth inductor 414 comprises a first and a second port. The input port 402 couples to the first port of the ninth capacitor 404 and the first port of the fifth inductor 408. The second port of the fifth inductor 408 couples to the first port of the tenth capacitor 406, and the first port of the sixth inductor 414. The second port of the sixth inductor 414 couples to the first port of the eleventh capacitor 412 to form the output port 418. The second port of the ninth capacitor 404, the second port of the tenth capacitor 406, and the second port of the eleventh capacitor 412 each couple to ground 416.

In one embodiment, the components of the lumped circuit implementation 400 have the following values. These values correspond to an embodiment where there is constant impedance transformation across wideband 118 MHz to 137 MHz. It is understood that these values can be manipulated by one skilled in the art to produce similar results and that these are provided as an example. The input port 402 is configured to have a resistance of 40Ω and the output port 418 is configured to have a resistance of 50Ω. The ninth capacitor 404 is configured to have a capacitance of 29.54 pF, the tenth capacitor 406 is configured to have a capacitance of 55.04 pF, and the eleventh capacitor 412 is configured to have a capacitance of 25.5 pF. The fifth inductor 408 is configured to have an inductance of 53 nH, and the sixth inductor 414 is configured to have an inductance of 59.3 nH.

Figure 5:
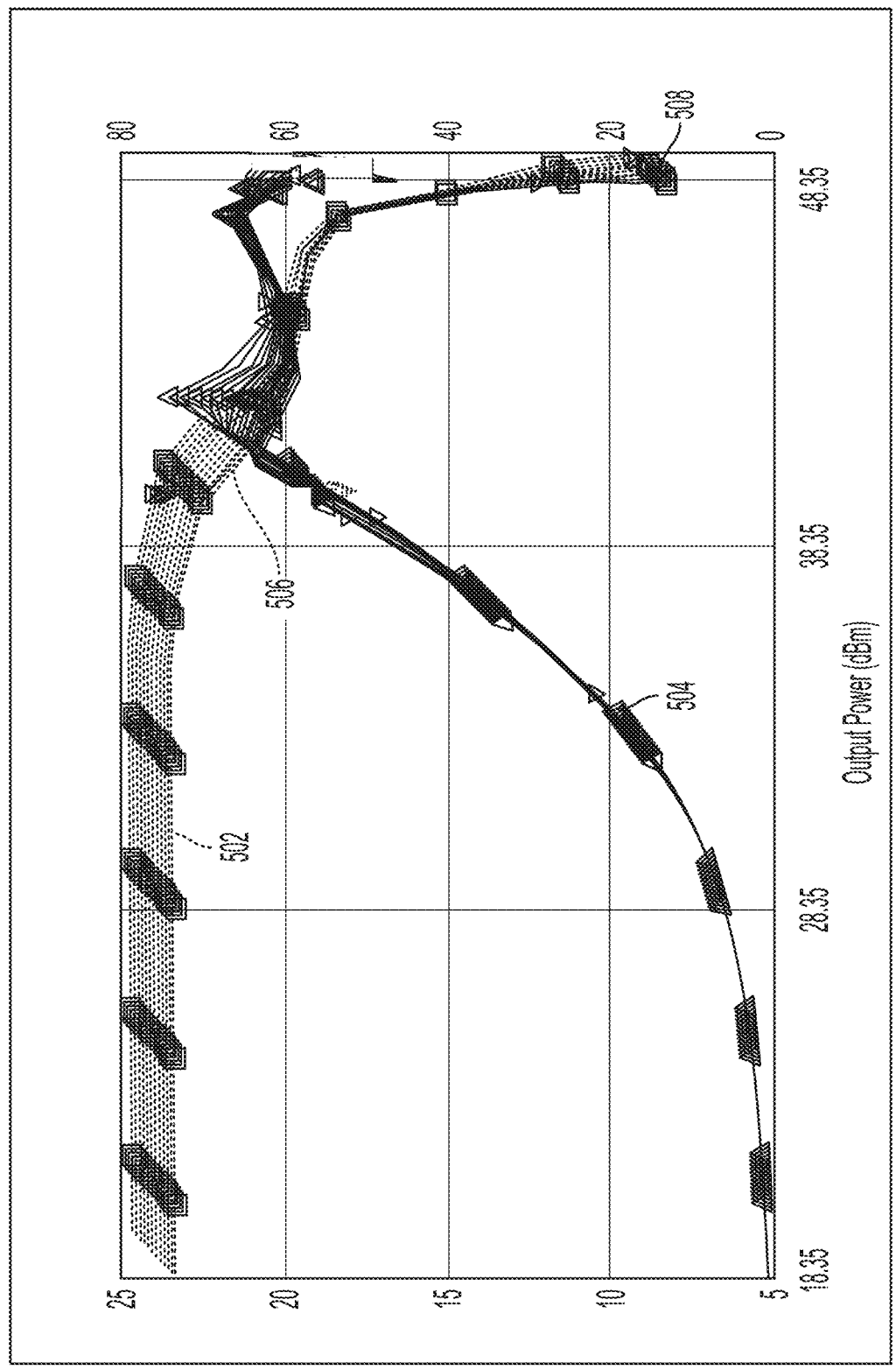
FIG. 5 is a graph depicting gain versus power for one embodiment of a wide band Doherty amplifier at various frequencies between 118 MHz and 137 MHz.

FIG. 5 is a graph depicting gain and power added efficiency (PAE) vs Power output for an actual circuit under test using the wide band Doherty power amplifier 100 as described in FIGS. 2-4 where $Z_t=2*R_{opt}$ at various frequencies across the wide band range. The frequencies range from 118 MHz to 137 MHz, each with similar results as depicted. Note that the small signal gain is flat at approximately 24 dB with limited variance of approximately +/−0.6 dB across tested range of frequencies. The Power input (dBm) versus Gain (dB curves 502 each show similar results for frequencies between 118 MHz and 137 MHz. Each curve of the collective curves 502 is for an integer frequency between 118 MHz and 137 MHz with 118 MHz being at the top of the collective curves 502 and 137 MHz at the bottom of the collective curves 502. For small input signals, the amplifier consistently provides a gain of approximately 24+/−0.6 dB for each of the frequencies tested from approximately an RF output power of 18.35 dBm to 38.35 dBm. As indicated at the reference number 506, while the gain drops off at an output power of approximately 38.35 dBm, the gain drops comparably for each of the frequencies. The Power output (dBm) versus PAE curves (lower value is more efficient) depicts similar PAE for the amplification of each of the tested frequencies. At 45 dBm (Peak power), indicated at 508, the PAE averages at 61.4% for the range of frequencies with approximately +/−1% variation over the range of frequencies 118 MHz to 137 MHz (60.3% to 62.4%). At 39 dBm (6 dB back-off), indicated at 506, the PAE averages at 50.5% for the range of frequencies with approximately +/−2% variation over the range of frequencies 118 MHz to 137 MHz (48.5% to 52.4%). Until the drop-off point at approximately 40 dBm 506, the PAE curve increases exponentially.

Figure 6:
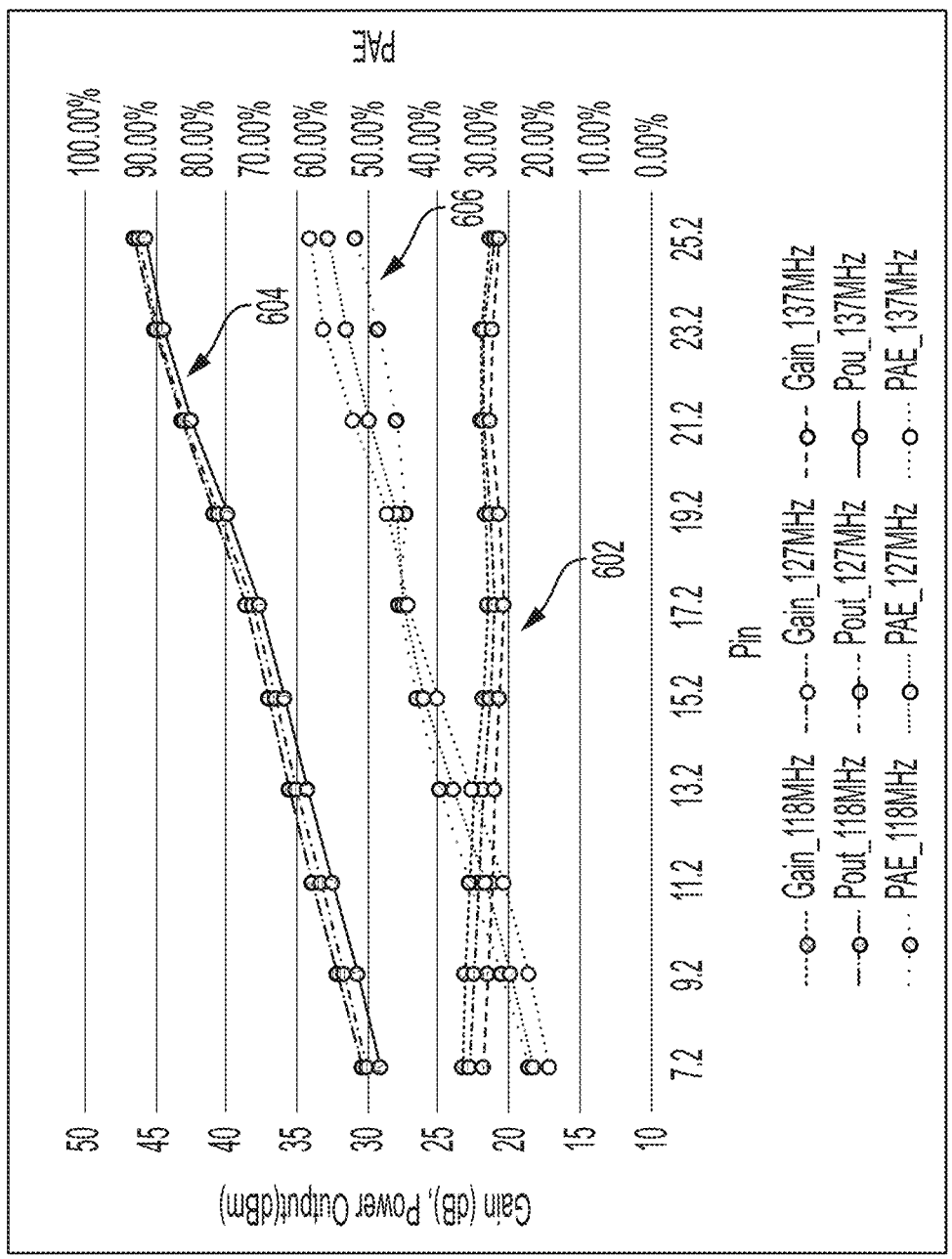
FIG. 6 is a graph depicting gain and power output versus power input for one embodiment of a wide band Doherty amplifier at 118 MHz, 127 MHz, and 137 MHz, where the carrier amplifier is biased at 50 mA.

FIG. 6 is a graph depicting gain (dB) 602, Power output (Pout) (dBm) 604 and PAE (%) 606 vs Power input at 118 MHz, 127 MHz, and 137 HMz where the carrier amplifier 106 is biased at 50 mA in class AB and the peaking amplifier 108 is biased accordingly in class C. The Gain versus Power input plots range from 23.2 dB to 20.60 dB across 7.2 dBm to 25.2 dBm power input for each of the wideband frequencies. The Power output versus power input plots range from 29 dBm to 46.5 dBm across 7.2 dBm to 25.2 dBm power input for each of the wideband frequencies. The gain and power output variation is minimal at peak power across the entire frequency band. Furthermore, the system achieves minimally 40% efficiency at 6 dB back off at the 46 dBm peak power output.

Figure 7:
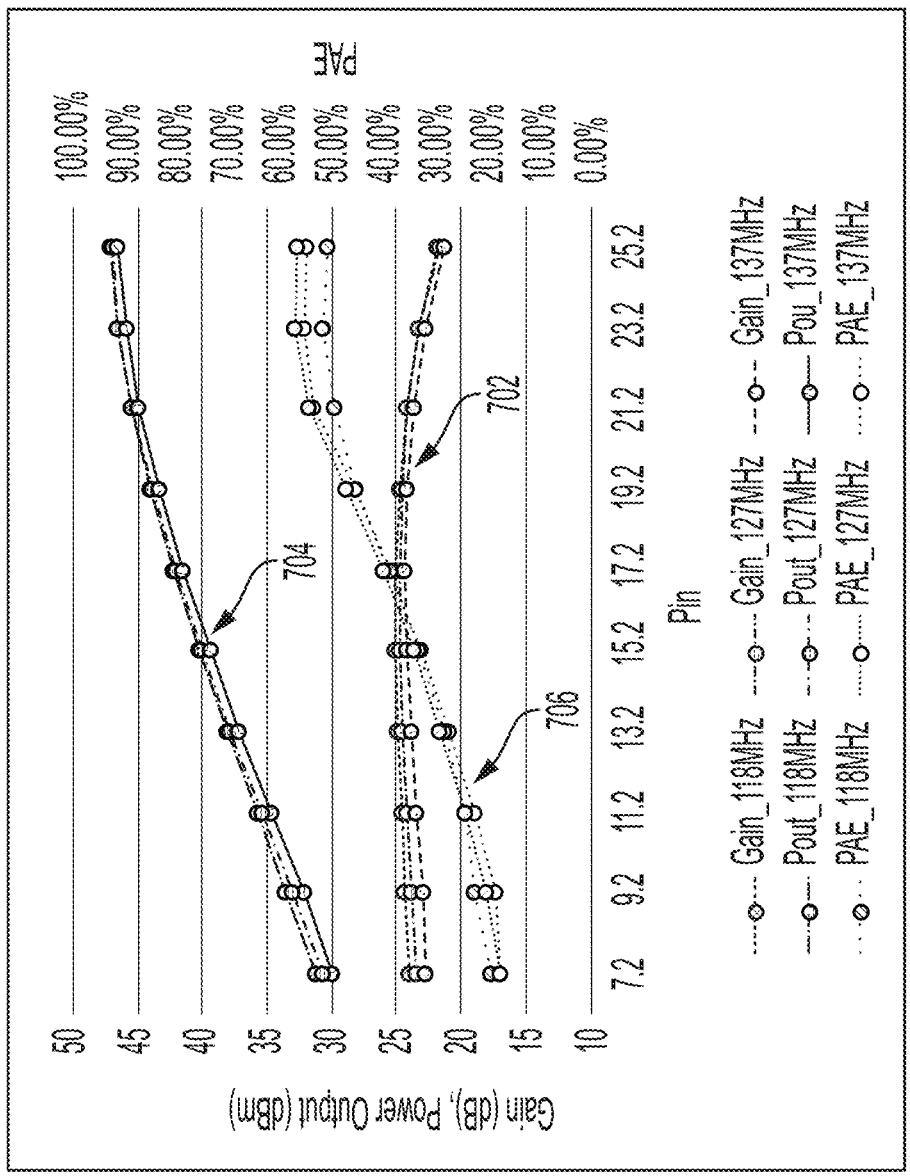
FIG. 7 is a graph depicting gain and power output versus power input for one embodiment of a wide band Doherty amplifier at 118 MHz, 127 MHz, and 137 MHz, where the carrier amplifier is biased at 100 mA.

FIG. 7 is a graph depicting gain (dB) 702, Power output (Pout) (dBm) 704 and PAE (%) 706 vs Power input at 118 MHz, 127 MHz, and 137 HMz where the carrier amplifier 106 is biased at 100 mA (class AB) and the peaking amplifier 108 is biased accordingly in class C. The Gain versus Power input plots range from 22.8 dB to 21.30 dB across 7.2 dBm to 25.2 dBm power input for each of the wideband frequencies. The Power output versus power input plots range from 30 dBm to 47 dBm across 7.2 dBm to 25.2 dBm power input for each of the wideband frequencies. The gain and power output variation is minimal at peak power across the entire frequency band. Furthermore, the system achieves minimally 32% efficiency at 6 dB back off at the 46 dBm peak power output.

Figure 8:
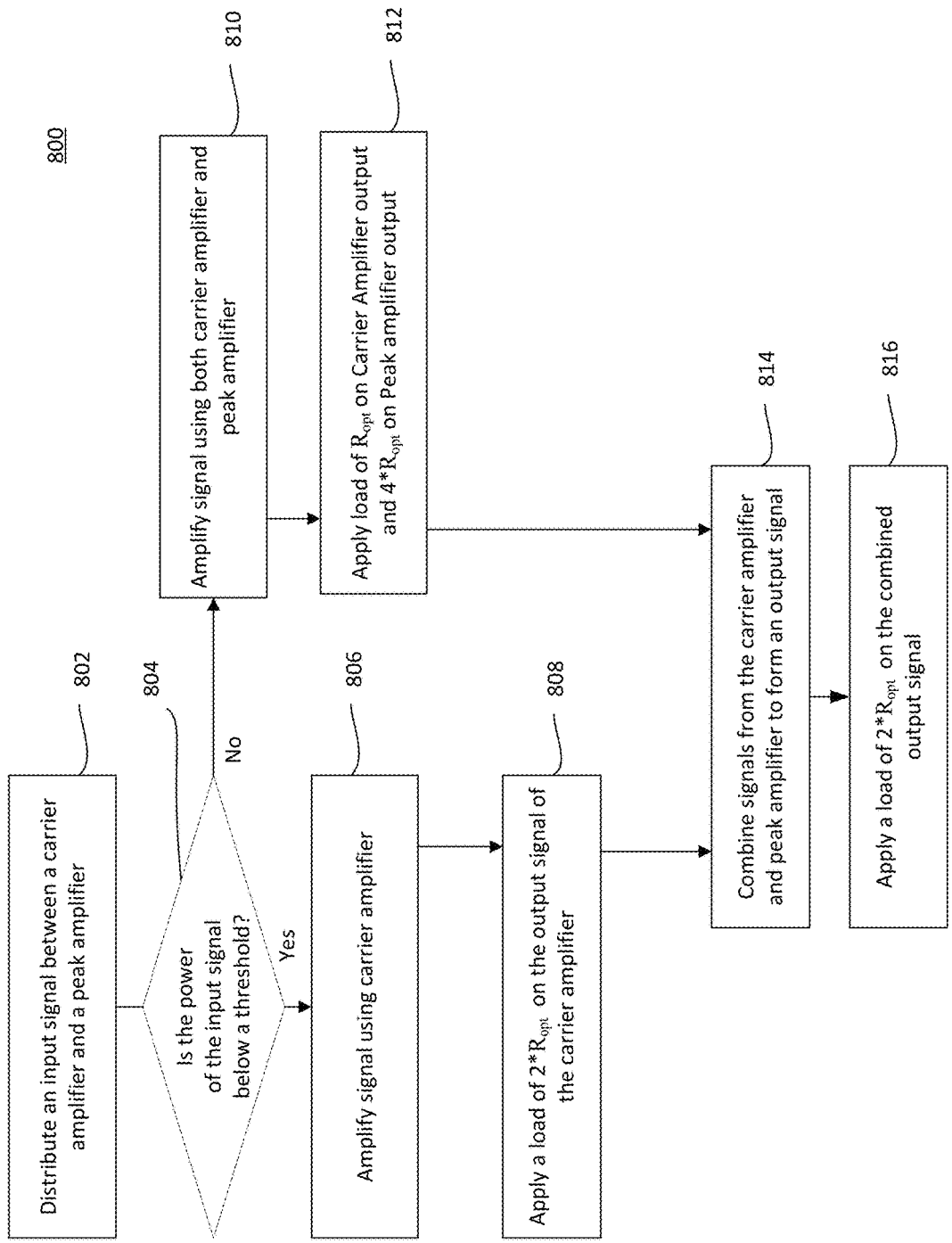
FIG. 8 is a method flow diagram of the wideband Doherty amplifier.

FIG. 8 is an example method 800 for operation of a wideband Doherty amplifier, such as the embodiments of a wideband Doherty amplifier described above with respect to FIGS. 1-7.

In block 802, method 800 distributes an input signal between a carrier amplifier and a peak amplifier, wherein the carrier amplifier receives the entirety of the input signal below a threshold and the carrier amplifier and peak amplifier each receive a portion of the input signal above the threshold. In some examples, the input signal comprises a frequency within or around 118 MHz to 137 MHz. When the power level of the input signal is below a threshold, which, in some examples, is 6 dB, the carrier amplifier provides the entirety of the amplification. When the input signal is below this threshold, in some examples the peak amplifier is configured to function as an open circuit, such that a nominal amount of current can flow through the peak amplifier. Above the threshold, the peak amplifier gradually provides more amplification while the carrier amplifier remains near its saturation point.

At block 804, process 800 selects one of two paths based on whether the power of the input signal is below the threshold. If the power of the input signal is below the threshold, then method 800 proceeds to block 806. In block 806, because the power is below the threshold, in some examples 6 dB, the carrier amplifier effectively amplifies the entirety of the signal and the peak amplifier will be "off." If the input power is above the threshold, the method proceeds to block 810. In block 810, because the power of the input signal is above the threshold, the carrier amplifier remains near saturation as the peak amplifier gradually amplifies a greater portion of the input signal. In some examples, when the input signal is split between the carrier amplifier and the peak amplifier, the two split signals are out of phase by 90 degrees.

In block 808, following block 806, method 800 applies a first load on the output of the carrier amplifier, wherein the first load impedance is approximately equal to $2*R_{opt}$, where $R_{opt}$ is a termination impedance for each of the carrier amplifier and peak amplifier that results in high power output of each of such amplifiers. The load on the output of the carrier amplifier may be achieved through the use of a quarter wave TL impedance inverter. In some examples, $R_{opt}$ is a termination impedance for each of the carrier amplifier and peak amplifier that results in maximum power output of each of such amplifiers. In further examples, $R_{opt}$ is a termination impedance for each of the carrier amplifier and peak amplifier that results in maximum power output of the carrier amplifier alone.

In block 812, following block 810, method 800 applies a first load on the output of the carrier amplifier, wherein the first load impedance is approximately equal to $R_{opt}$, and a second load on the output of the peak amplifier, wherein the second load impedance is approximately equal to $4*R_{opt}$, where $R_{opt}$ is a termination impedance for each of the carrier amplifier and peak amplifier that results in high power output of each of such amplifiers. The load on the output of the carrier amplifier may be achieved through the use of a quarter wave TL impedance inverter. In some examples $R_{opt}$ is a termination impedance for each of the carrier amplifier and peak amplifier that results in maximum power output of each of such amplifiers. In further examples, $R_{opt}$ is a termination impedance for each of the carrier amplifier and peak amplifier that results in maximum power output of the carrier amplifier alone. In this configuration, both amplifiers deliver the same power, as the peak amplifier is biased such that it delivers half the current across 4 times the load of the carrier amplifier.

In block 814, method 800 combines signals from the carrier amplifier and the peak amplifier to form an output signal. In some examples, the carrier amplifier signal and the peak amplifier signal are out of phase and require a phase shift in order to be combined. In such examples, a phase shift is conducted on one or both of the signals.

In block 816, apply a load impedance on the output signal, wherein the second load impedance is approximately $2*R_{opt}$. The load on the output of the combined signals from the carrier amplifier and the peak amplifier may be achieved through the use of an impedance transformer.

Figure 9:
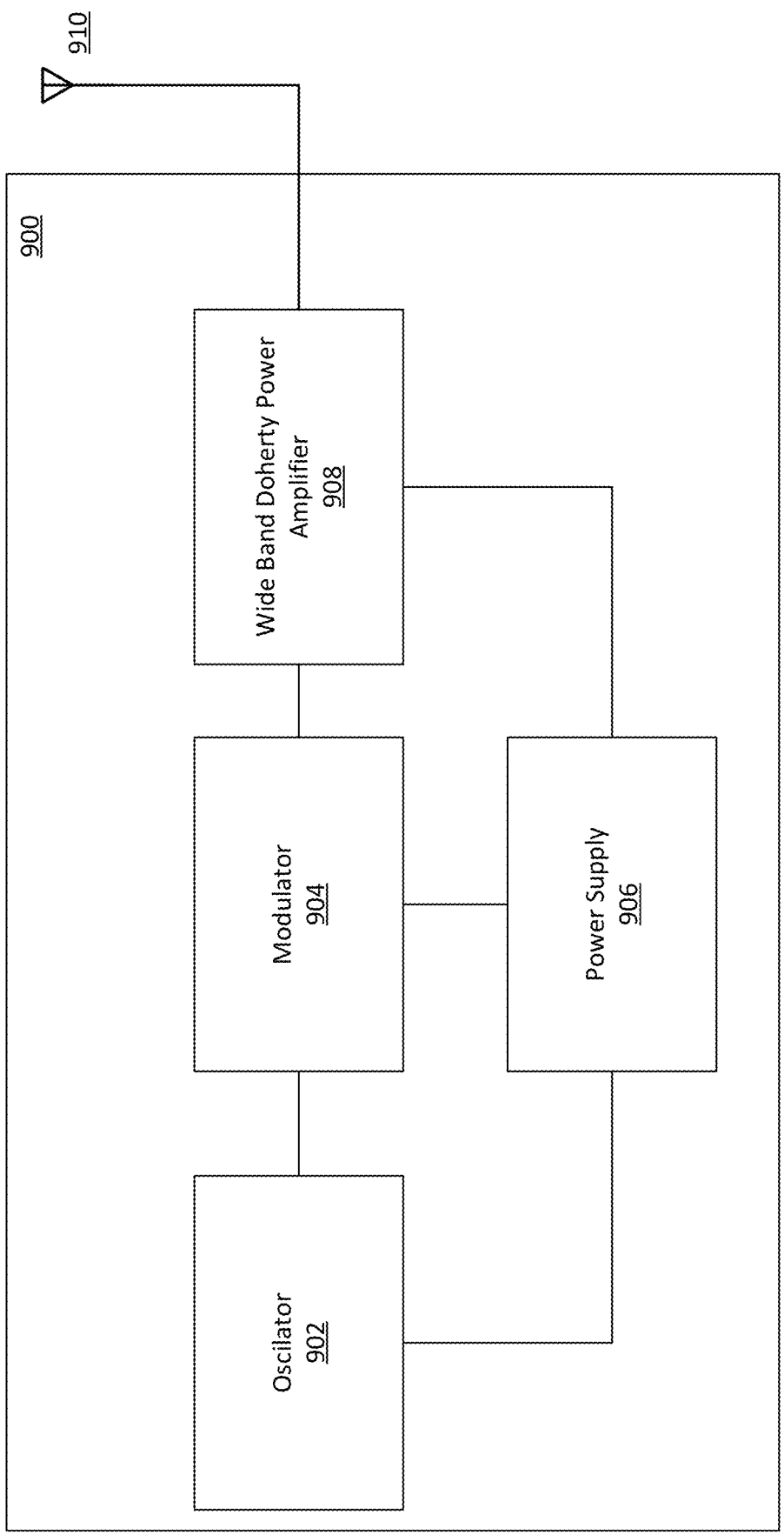
FIG. 9 is a block diagram of one embodiment of a radio implementing the wide band Doherty amplifier.

FIG. 9 is a block diagram of a radio 900 implementing the wideband Doherty power amplifier 908. It is understood that there are many different implementations of radios, transmitters, and other devices using power amplifiers. This block diagram of a radio 900 provides an example embodiment of one potential use for the wideband Doherty amplifier. It is understood that radios using power amplification may be configured differently than the radio 900. A person having skill in the art would be able to determine how to use a wideband Doherty power amplifier 908 in the context of a radio. The radio 900 comprises an oscillator 902, a modulator 804, a power supply 906, and the wideband Doherty power amplifier 908. The radio 900 may be coupled to one or more antenna 910. The wideband Doherty power amplifier 908 comprises the Doherty amplifier as described with respect to one or more of FIGS. 1-8, and descriptions within those figures should apply to FIG. 9 as well. In some examples, the radio 900 comprises a VHF VDL Mode2 radio transmitter.

The oscillator 902 is coupled to the modulator 904 and provides an input signal to the modulator 904. In some examples, the modulator 904 modulates the input signal to encode information into the signal provided by the oscillator 902. In some examples, the input signal comprises a frequency within or around the range of 118 MHz to 137 MHz. The modulator 904 is coupled to the wideband Doherty power amplifier 908. The wideband Doherty power amplifier 908 amplifies the input signal from the modulator 904 as described with respect to one or more of FIGS. 1-8.

The oscillator 902, the modulator 904, and the wideband Doherty power amplifier 908 are all coupled to a power supply 906 which provides each of the components with power necessary for signal generation and signal amplification.

The radio 900 through the wideband Doherty power amplifier 908 provides an output signal to the antenna 910. The radio 900 may be configured to receive and/or transmit signals through the antenna 910. In some examples, the antenna 910 has a characteristic load impedance of $Z_L$.

EXAMPLE EMBODIMENTS

Example 1 includes a wideband power amplifier configured to be coupled to a load having an impedance ZL, where the wideband power amplifier comprises: a quadrature coupler, implemented with lumped element impedance transformation circuitry, comprising an input, a first output, and a second output; a carrier amplifier comprising an input and an output, where the input of the carrier amplifier is coupled to the first output of the quadrature coupler; a peak amplifier comprising an input and an output, where the input of the peak amplifier is coupled to the second output of the quadrature coupler; wherein the carrier amplifier saturates at an input power level lower than the input power level at which the peak amplifier saturates; wherein each of the carrier amplifier and the peak amplifier has a termination impedance of approximately Ropt, where Ropt is the optimum impedance at which the carrier amplifier and the peak amplifier will deliver rated max powers; a quarter wave transmission line impedance inverter, implemented with lumped element impedance transformation circuitry, comprising an input and an output, and having a characteristic impedance of 2*Ropt, wherein the input of the quarter wave transmission line impedance inverter is coupled to the output of the carrier amplifier; an impedance transformer, implemented with lumped element impedance transformation circuitry, comprising an input and an output, and where the input of the impedance transformer is coupled to the output of the peak amplifier and the output of the impedance transformer; wherein the impedance transformer is configured transform a load impedance ZL to 2*Ropt; and wherein a change in a phase shift over frequency of the impedance transformer is cancelled by a corresponding opposite change in phase shift of the quadrature coupler over at least a bandwidth, of fifteen percent or more of the center frequency, about the center frequency.

Example 2 includes the wideband power amplifier of Example 1, wherein the carrier amplifier is biased to consistently provide amplification to the output of the quadrature coupler; and wherein the peak amplifier is biased to gradually provide amplification above a threshold power input.

Example 3 includes the wideband power amplifier of Example 2, wherein the threshold power input is 6 dB.

Example 4 includes the wideband power amplifier system of Examples 1-3, wherein at least one of the carrier amplifier and the peak amplifier comprises GaN transistors.

Example 5 includes the wideband power amplifier system of Examples 1-4, wherein the carrier amplifier is one of a class A amplifier, a class AB amplifier, and a class B amplifier; and wherein the peak amplifier is a class C amplifier.

Example 6 includes the wide band power amplifier system of Examples 1-5, wherein the carrier amplifier and the peak amplifier have a termination impedance of Ropt.

Example 7 includes the wideband power amplifier system of Examples 1-6, wherein the wideband power amplifier is configured to operate with an input signal with a frequency around the range of 118 MHz to 137 MHz.

Example 8 includes the wideband power amplifier of Examples 1-7, wherein the quadrature coupler comprises: a first capacitor comprising a first port and a second port; a second capacitor comprising a first port and a second port; wherein the second port of the first capacitor and the second port of the second capacitor are coupled and form an input of the quadrature coupler; a third capacitor comprising a first port and a second port; a fourth capacitor comprising a first port and a second port; a first inductor comprising a first port and a second port; a second inductor comprising a first port and a second port; wherein a first port of the first capacitor and the first port of the third capacitor are coupled to the first port of the first inductor; wherein a first port of the second capacitor and a first port of a fourth capacitor are coupled to the first port of the second inductor; a first resistor comprising a first port and a second port, where the first port of the first resistor is coupled to the second port of the third capacitor forming a first output of the quadrature coupler, and the second port of the first resistor is coupled to the second port of the fourth capacitor; a fifth capacitor comprising a first port and a second port; a sixth capacitor comprising a first port and a second port; a third inductor comprising a first port and a second port, where the first port of the third inductor is coupled to the first port of the fifth capacitor, the second port of the fourth capacitor, and the second port of the first resistor; wherein the second port of the fifth capacitor is coupled to the second port of the sixth capacitor; and wherein the second port of the third inductor is coupled to the first port of the sixth capacitor, and form a second output of the quadrature coupler.

Example 9 includes the wideband power amplifier of Examples 1-8, wherein the quarter wave transmission line impedance inverter comprises: a fourth inductor comprising a first port and a second port, where the first port and the second of the fourth inductor respectively form the input and the output of the impedance transformer; a seventh capacitor comprising a first port and a second port, where the first port of the seventh capacitor is coupled to the first port of the third inductor; and an eighth capacitor comprising a first port and a second port, where the first port of the eighth capacitor is coupled to the second port of the third inductor; and wherein the quarter wave transmission line impedance inverter has a characteristic impedance of 2*Ropt.

Example 10 includes the wideband power amplifier of Examples 1-9, wherein the impedance transformer comprises: a ninth capacitor having a first port and a second port; a tenth capacitor having a first port and a second port; an eleventh capacitor having a first port and a second port; a fifth inductor comprising a first port and a second port, where the first port of the ninth capacitor is coupled to the first port of the fifth inductor, and where the first port of the tenth capacitor is coupled to the second port of the fifth inductor; a sixth inductor comprising a first port and a second port, where the first port of the eleventh capacitor is coupled to the second port of the sixth inductor, and where the first port of the eleventh capacitor is coupled to the first port of the sixth inductor; and wherein a load is configured to be coupled to the output of the impedance transformer and have an impedance of 2*Ropt.

Example 11 includes the wideband power amplifier of Examples 1-10, wherein a load impedance presented to the carrier amplifier is Ropt when the carrier amplifier is operating at high saturated power levels, and wherein the load impedance presented to the carrier amplifier is 2*Ropt when the carrier amplifier is operating at 6 dB backed off compression for the carrier amplifier.

Example 12 includes a system comprising: a radio comprising a wideband power amplifier configured to be coupled to a load having a characteristic impedance ZL, where the wideband power amplifier system comprises: a quadrature coupler, implemented with lumped element impedance transformation circuitry, comprising an input, a first output, and a second output; a carrier amplifier comprising an input and an output, where the input of the carrier amplifier is coupled to the first output of the quadrature coupler; a peak amplifier comprising an input and an output, where the input of the peak amplifier is coupled to the second output of the quadrature coupler; wherein the carrier amplifier saturates at an input power level lower than the input power level at which the peak amplifier saturates; wherein each of the carrier amplifier and the peak amplifier has a termination impedance, Ropt, where Ropt is the optimum impedance at which the carrier amplifier and the peak amplifier will deliver rated max powers; a quarter wave transmission line impedance inverter, implemented with lumped element impedance transformation circuitry, comprising an input and an output, and having a characteristic impedance of 2*Ropt, wherein the input of the quarter wave transmission line impedance inverter is coupled to the output of the carrier amplifier; an impedance transformer, implemented with lumped element impedance transformation circuitry, comprising an input and an output, and where the input of the impedance transformer is coupled to the output of the peak amplifier and the output of the impedance transformer; wherein the impedance transformer is configured transform a characteristic impedance of a load (ZL) to 2*Ropt; and wherein a change in a phase shift over frequency of the impedance transformer is cancelled by a corresponding opposite change in phase shift of the quadrature coupler over at least a bandwidth, of fifteen percent or more of the center frequency, about the center frequency.

Example 13 includes the system of Example 12, wherein the radio is configured as a VHF VDL Mode2 radio transmitter configured to operate over a wideband of frequencies.

Example 14 includes the system of Examples 12-13, wherein the wideband of frequencies comprises 118 MHz to 137 MHz.

Example 15 includes the system of Example 14, wherein the carrier amplifier has a consistent load impedance regardless of frequency.

Example 16 includes the system of Examples 12-15, wherein the carrier amplifier is biased to consistently provide amplification and of the output of the quadrature coupler; and wherein the peak amplifier is biased to gradually provide amplification above a threshold gain.

Example 17 includes a method comprising: distribute an input signal between a carrier amplifier and a peak amplifier, wherein the carrier amplifier receives the entirety of the input signal below a threshold and the carrier amplifier and peak amplifier each receive a portion of the input signal above the threshold; apply a first load on the output of the carrier amplifier, wherein the first load impedance is approximately equal to 2*Ropt, where Ropt is the optimum impedance at which the carrier amplifier and the peak amplifier will deliver rated max powers; combine signals from the carrier amplifier and the peak amplifier to form an output signal; and apply a second load impedance on the output signal, wherein the second load impedance is approximately 2*Ropt.

Example 18 includes the method of Example 17, wherein Ropt is a termination impedance for each of the carrier amplifier and peak amplifier that results in maximum power output of each of such amplifiers.

Example 19 includes the method of Examples 17-18, wherein the carrier amplifier and the peak amplifier have a termination impedance of Ropt.

Example 20 includes the method of Examples 17-19, wherein the input signal comprises a frequency within and including 118 MHz to 137 MHz.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A wideband power amplifier configured to be coupled to a load having an impedance $Z_L$, where the wideband power amplifier comprises:
    a quadrature coupler, implemented with lumped element impedance transformation circuitry, comprising an input, a first output, and a second output;
    a carrier amplifier comprising an input and an output, where the input of the carrier amplifier is coupled to the first output of the quadrature coupler;
    a peak amplifier comprising an input and an output, where the input of the peak amplifier is coupled to the second output of the quadrature coupler;
    wherein the carrier amplifier saturates at an input power level lower than an input power level at which the peak amplifier saturates;
    wherein each of the carrier amplifier and the peak amplifier has a termination impedance of approximately $R_{opt}$, where $R_{opt}$ is the optimum impedance at which the carrier amplifier and the peak amplifier will deliver rated maximum powers;
    a quarter wave transmission line impedance inverter, implemented with lumped element impedance transformation circuitry, comprising an input and an output, and having a characteristic impedance of $2*R_{opt}$, wherein the input of the quarter wave transmission line impedance inverter is coupled to the output of the carrier amplifier;
    an impedance transformer, implemented with lumped element impedance transformation circuitry, comprising an input and an output, and where the input of the impedance transformer is coupled to the output of the peak amplifier and the output of the quarter wave transmission line impedance inverter;
    wherein the impedance transformer is configured transform a load impedance $Z_L$ to $2*R_{opt}$;
    wherein a change in a phase shift over frequency of the impedance transformer is cancelled by a corresponding opposite change in phase shift of the quadrature coupler over at least a bandwidth, of fifteen percent or more of a center frequency, about the center frequency; and
    wherein the quadrature coupler comprises:
        a first capacitor comprising a first port and a second port;
        a second capacitor comprising a first port and a second port;
        wherein the second port of the first capacitor and the second port of the second capacitor are coupled and form an input of the quadrature coupler;
        a third capacitor comprising a first port and a second port;

a fourth capacitor comprising a first port and a second port;
a first inductor comprising a first port and a second port;
a second inductor comprising a first port and a second port;
wherein the first port of the first capacitor and the first port of the third capacitor are coupled to the first port of the first inductor;
wherein the first port of the second capacitor and a first port of the fourth capacitor are coupled to the first port of the second inductor;
a first resistor comprising a first port and a second port, where the first port of the first resistor is coupled to the second port of the third capacitor to form a first output of the quadrature coupler, and the second port of the first resistor is coupled to the second port of the fourth capacitor;
a fifth capacitor comprising a first port and a second port;
a sixth capacitor comprising a first port and a second port;
a third inductor comprising a first port and a second port, where the first port of the third inductor is coupled to the first port of the fifth capacitor, the second port of the fourth capacitor, and the second port of the first resistor;
wherein the second port of the fifth capacitor is coupled to the second port of the sixth capacitor;
wherein the second port of the fifth capacitor and the second port of the sixth capacitor are coupled to a ground terminal; and
wherein the second port of the third inductor is coupled to the first port of the sixth capacitor to form a second output of the quadrature coupler.

2. The wideband power amplifier of claim 1, wherein the carrier amplifier is biased to consistently provide amplification to the output of the quadrature coupler; and
wherein the peak amplifier is biased to gradually provide amplification above a threshold power input.

3. The wideband power amplifier of claim 2, wherein the threshold power input is 6 dB back off from output power saturation.

4. The wideband power amplifier of claim 1, wherein at least one of the carrier amplifier and the peak amplifier comprises GaN transistors.

5. The wideband power amplifier of claim 1, wherein the carrier amplifier is one of a class A amplifier, a class AB amplifier, and a class B amplifier; and
wherein the peak amplifier is a class C amplifier.

6. The wide band power amplifier of claim 1, wherein the carrier amplifier and the peak amplifier have a termination impedance of $R_{opt}$.

7. The wideband power amplifier of claim 1, wherein the wideband power amplifier is configured to operate with an input signal with a frequency around the range of 118 MHz to 137 MHz.

8. The wideband power amplifier of claim 1, wherein the quarter wave transmission line impedance inverter comprises:
a fourth inductor comprising a first port and a second port, where the first port and the second port of the fourth inductor respectively form the input and the output of the quarter wave transmission line impedance inverter;
a seventh capacitor comprising a first port and a second port, where the first port of the seventh capacitor is coupled to the first port of the fourth inductor; and
an eighth capacitor comprising a first port and a second port, where the first port of the eighth capacitor is coupled to the second port of the fourth inductor; and
wherein the quarter wave transmission line impedance inverter has a characteristic impedance of $2*R_{opt}$.

9. The wideband power amplifier of claim 1, wherein the impedance transformer comprises:
a ninth capacitor having a first port and a second port;
a tenth capacitor having a first port and a second port;
an eleventh capacitor having a first port and a second port;
a fifth inductor comprising a first port and a second port, where the first port of the ninth capacitor is coupled to the first port of the fifth inductor, and where the first port of the tenth capacitor is coupled to the second port of the fifth inductor;
a sixth inductor comprising a first port and a second port, where the first port of the eleventh capacitor is coupled to the second port of the sixth inductor, and where the first port of the tenth capacitor is coupled to the first port of the sixth inductor; and
wherein a load is configured to be coupled to the output of the impedance transformer and has an impedance of $2*R_{opt}$.

10. The wideband power amplifier of claim 1, wherein a load impedance presented to the carrier amplifier is $R_{opt}$ when the carrier amplifier is operating at high saturated power levels, and wherein the load impedance presented to the carrier amplifier is $2*R_{opt}$ when the carrier amplifier is operating at 6 dB backed off compression for the carrier amplifier.

11. The wideband power amplifier of claim 1, wherein the wideband power amplifier is operative to perform a method comprising:
distributing an input signal between the carrier amplifier and the peak amplifier, wherein the carrier amplifier receives the entirety of the input signal below a threshold and the carrier amplifier and peak amplifier each receive a portion of the input signal above the threshold;
applying a first load on the output of the carrier amplifier, wherein a first load impedance is approximately equal to $2*R_{opt}$, where $R_{opt}$ is the optimum impedance at which the carrier amplifier and the peak amplifier will deliver rated maximum powers;
combining signals from the carrier amplifier and the peak amplifier to form an output signal; and
applying a second load impedance on the output signal, wherein the second load impedance is approximately $2*R_{opt}$.

12. The wideband power amplifier of claim 11, wherein $R_{opt}$ is a termination impedance for each of the carrier amplifier and peak amplifier that results in maximum power output of each of such amplifiers.

13. The wideband power amplifier of claim 11, wherein the carrier amplifier and the peak amplifier have a termination impedance of $R_{opt}$.

14. The wideband power amplifier of claim 11, wherein the input signal comprises a frequency within and including 118 MHz to 137 MHz.

15. A system comprising:
a radio comprising a wideband power amplifier configured to be coupled to a load having a characteristic impedance $Z_L$, where the wideband power amplifier system comprises:
a quadrature coupler, implemented with lumped element impedance transformation circuitry, comprising an input, a first output, and a second output;

a carrier amplifier comprising an input and an output, where the input of the carrier amplifier is coupled to the first output of the quadrature coupler;

a peak amplifier comprising an input and an output, where the input of the peak amplifier is coupled to the second output of the quadrature coupler;

wherein the carrier amplifier saturates at an input power level lower than the input power level at which the peak amplifier saturates;

wherein each of the carrier amplifier and the peak amplifier has a termination impedance, $R_{opt}$, where $R_{opt}$ is the optimum impedance at which the carrier amplifier and the peak amplifier will deliver rated max powers;

a quarter wave transmission line impedance inverter, implemented with lumped element impedance transformation circuitry, comprising an input and an output, and having a characteristic impedance of $2*R_{opt}$, wherein the input of the quarter wave transmission line impedance inverter is coupled to the output of the carrier amplifier;

an impedance transformer, implemented with lumped element impedance transformation circuitry, comprising an input and an output, and where the input of the impedance transformer is coupled to the output of the peak amplifier and the output of the quarter wave transmission line impedance inverter;

wherein the impedance transformer is configured transform a characteristic impedance of a load ($Z_L$) to $2*R_{opt}$;

wherein a change in a phase shift over frequency of the impedance transformer is cancelled by a corresponding opposite change in phase shift of the quadrature coupler over at least a bandwidth, of fifteen percent or more of a center frequency, about the center frequency; and wherein the impedance transformer comprises:
a ninth capacitor having a first port and a second port;
a tenth capacitor having a first port and a second port;
an eleventh capacitor having a first port and a second port;
a fifth inductor comprising a first port and a second port, where the first port of the fifth inductor is coupled to the first port of the ninth capacitor, and where the first port of the tenth capacitor is coupled to the second port of the fifth inductor;
a sixth inductor comprising a first port and a second port, where the first port of the eleventh capacitor is coupled to the second port of the sixth inductor, and where the first port of the tenth capacitor is coupled to the first port of the sixth inductor;
wherein the second port of the ninth capacitor, the second port of the tenth capacitor, and the second port of the eleventh capacitor are coupled to a ground terminal; and
wherein a load is configured to be coupled to the output of the impedance transformer and has an impedance of $2*R_{opt}$.

16. The system of claim 15, wherein the radio is configured as a VHF VDL Mode2 radio transmitter configured to operate over a wideband of frequencies.

17. The system of claim 16, wherein the wideband of frequencies comprises 118 MHz to 137 MHz.

18. The system of claim 17, wherein the carrier amplifier has a consistent load impedance regardless of frequency.

19. The system of claim 15, wherein the carrier amplifier is biased to consistently provide amplification to the output of the quadrature coupler; and
wherein the peak amplifier is biased to gradually provide amplification above a threshold gain.

20. The system of claim 15, wherein:
the quadrature coupler comprises:
a first capacitor comprising a first port and a second port;
a second capacitor comprising a first port and a second port;
wherein the second port of the first capacitor and the second port of the second capacitor are coupled and form an input of the quadrature coupler;
a third capacitor comprising a first port and a second port;
a fourth capacitor comprising a first port and a second port;
a first inductor comprising a first port and a second port;
a second inductor comprising a first port and a second port;
wherein the first port of the first capacitor and the first port of the third capacitor are coupled to the first port of the first inductor;
wherein the first port of the second capacitor and a first port of the fourth capacitor are coupled to the first port of the second inductor;
a first resistor comprising a first port and a second port, where the first port of the first resistor is coupled to the second port of the third capacitor to form a first output of the quadrature coupler, and the second port of the first resistor is coupled to the second port of the fourth capacitor;
a fifth capacitor comprising a first port and a second port;
a sixth capacitor comprising a first port and a second port;
a third inductor comprising a first port and a second port, where the first port of the third inductor is coupled to the first port of the fifth capacitor, the second port of the fourth capacitor, and the second port of the first resistor;
wherein the second port of the fifth capacitor is coupled to the second port of the sixth capacitor; and
wherein the second port of the third inductor is coupled to the first port of the sixth capacitor to form a second output of the quadrature coupler; and wherein the quarter wave transmission line impedance inverter comprises:
a fourth inductor comprising a first port and a second port, where the first port and the second port of the fourth inductor respectively form the input and the output of the quarter wave transmission line impedance inverter;
a seventh capacitor comprising a first port and a second port, where the first port of the seventh capacitor is coupled to the first port of the fourth inductor; and
an eighth capacitor comprising a first port and a second port, where the first port of the eighth capacitor is coupled to the second port of the fourth inductor; and
wherein the quarter wave transmission line impedance inverter has a characteristic impedance of $2*R_{opt}$.

* * * * *